Figure 1:
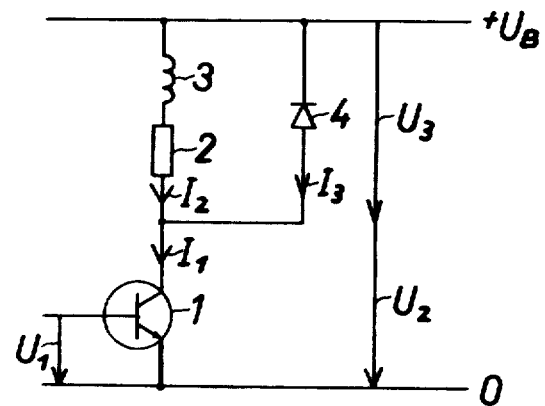

United States Patent
Hablützel

[11] 4,035,703
[45] July 12, 1977

[54] CURRENT CIRCUIT ARRANGEMENT FOR REDUCING THE SWITCH-ON POWER DISSIPATION OF A POWER TRANSISTOR

[75] Inventor: Kurt Hablützel, Wiesendangen, Switzerland

[73] Assignee: Rieter Machine Works, Ltd., Winterthur, Switzerland

[21] Appl. No.: 639,714

[22] Filed: Dec. 11, 1975

[30] Foreign Application Priority Data

Dec. 20, 1974 Switzerland .............. 17059/74

[51] Int. Cl.² ........................... H02D 5/16
[52] U.S. Cl. .................... 318/345 B; 318/227; 323/17; 323/DIG. 1; 363/131
[58] Field of Search .......... 318/227, 230, 341, 345; 323/17, DIG. 1; 321/45 ER, 45 C

[56] References Cited
U.S. PATENT DOCUMENTS

| | | | |
|---|---|---|---|
| 3,262,036 | 7/1966 | Clarke et al. | 318/230 |
| 3,293,532 | 12/1966 | Dubin et al. | 323/DIG. 1 |
| 3,460,021 | 8/1969 | Schlabach | 321/45 C |
| 3,619,753 | 11/1971 | Thompson | 321/45 C X |
| 3,736,495 | 5/1973 | Calkin et al. | 323/17 |

*Primary Examiner*—Gene Z. Rubinson
*Attorney, Agent, or Firm*—Kenyon & Kenyon, Reilly, Carr & Chapin

[57] ABSTRACT

The current circuit arrangement is used to reduce the switch-on power dissipation of a power transistor which intermittently switches a direct-current voltage to an ohmic-inductive load and in which a voltage limiting diode is arranged parallel to the load. The current circuit arrangement employs a non-linear resistance member in series with the diode which resistance member includes at least one additional diode. In addition, a reactance member is used in parallel to the resistance member. Various one-phase and three-phase invertor stages may use the current arrangement.

9 Claims, 12 Drawing Figures

CURRENT CIRCUIT ARRANGEMENT FOR REDUCING THE SWITCH-ON POWER DISSIPATION OF A POWER TRANSISTOR

As is known in power transistor circuit arrangements, an inductive load is difficult to switch off. If the current is interrupted quickly, a high voltage peak which generally contains an ohmic portion is generated over the load and also over the switch. Such peak voltage can cause destruction of the switches. Semiconductor switches and transistors, in particular, are exposed to this danger. Thus, in order to protect such transistor switch arrangements, a diode has been arranged in parallel with the load, which diode in an "on" switching state is reverse-biased. In use, as the switch is opened, the diode takes up the generated voltage peak and the current flowing through the inductive load flows on via the diode and gradually diminishes.

The placement of a diode in parallel to the load thus acts as an effective protection against destruction of the switch as the switch is switched off. However, during a subsequent switching-on, an increased power dissipation may result in the switch due to this diode, particularly if a switched transistor is used. This is caused by the fact that the diode, if still in a conductive state, is still enriched with charge carriers in the barrier layer. When the transistor switch is switched on, then the diode, which is in a conductive state when the switch is off, has to be reverse-biased. Thus, a large current flows through the diode until the barrier layer is cleared. Since this current is supplied by the transistor, the switch-on power dissipation of the transistor is increased considerably.

This switch-on power dissipation reduces the life span of the transistor in many cases to a larger extent than the switch-off power dissipation and the operation power dissipation during the conducting phase. If the load current through the inductive load has not yet faded away at the time the transistor is switched on, and if the diode is still in a conductive stage, as the transistor is switched on again (which is always the case in an intermittent switching operation mode of power transistors) the diode represents a large capacity during the first moment. The inductive load charge of this large capacity then has to be removed. The current peaks thus generated are higher than the ones the transistor is capable of delivering. As long as the high collector current prevails, the collector-emitter voltage does not fall back to the small value corresponding to nominal operation in spite of the presence of a sufficient base-emitter current. As an extremely high collector current prevails during a certain time span and as the collector-emitter voltage is still up at almost the value of the supply voltage, the power dissipation in the transistor is excessively high during this switch-on period.

It thus is the objective of the present invention to eliminate the above mentioned disadvantages in the intermittent switching operation mode of power transistors.

It is another object of the invention to create a current circuit arrangement in which the current to be supplied by the transistor to the diode as the transistor is switched on again is diminished in such a manner that the voltage across the transistor is diminished at a faster rate.

It is another object of the invention to provide a current circuit arrangement which reduces the switching on dissipation of a power transistor.

It is another object of the invention to increase the life span of a power transistor which operates an intermittent load.

Briefly, the invention is directed to a current circuit arrangement for reducing the switch-on power dissipation of a power transistor which intermittently switches a direct current voltage to an ohmic-inductive load. This circuit arrangement uses a voltage limiting diode in parallel to the load which is biased in a blocking condition with the transistor in a conducting state and in a conducting condition with the transistor in a reverse-biased state. In addition, the circuit arrangement is characterized in that a nonlinear resistance member containing at least one diode is placed in series with the voltage limiting diode and a low-ohmic reactance is placed in parallel with the resistance member. The voltage time area of the reactance is made large enough so that the reactance limits the current after the transistor is switched on again until the voltage limiting diode takes up reverse voltage. The voltage time area of the reactance member is also small enough that the voltage at the reactance member, upon switching the transistor off, is diminished before the transistor is switched on again to a value which is lower than the forward voltage of the resistance member.

The nonlinear resistance member can also consist of two or more diodes arranged in series. Furthermore, the non-linear member can consist of a diode and of a zener diode arranged in series or a diode and a nonlinear resistance member.

Figure 3:
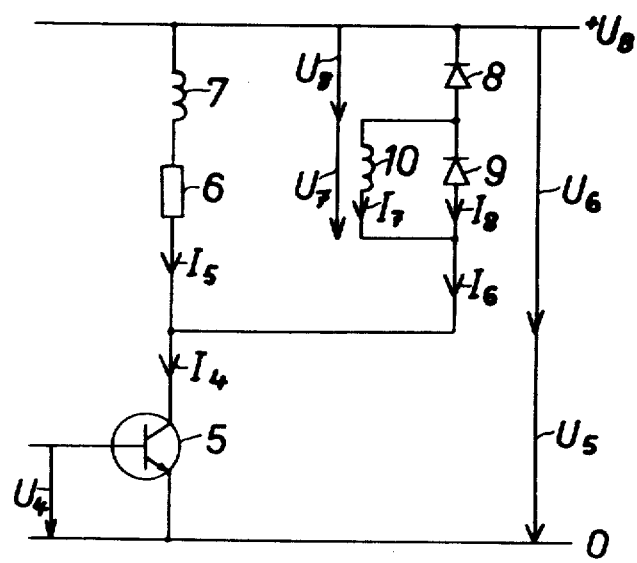
Figure 2:
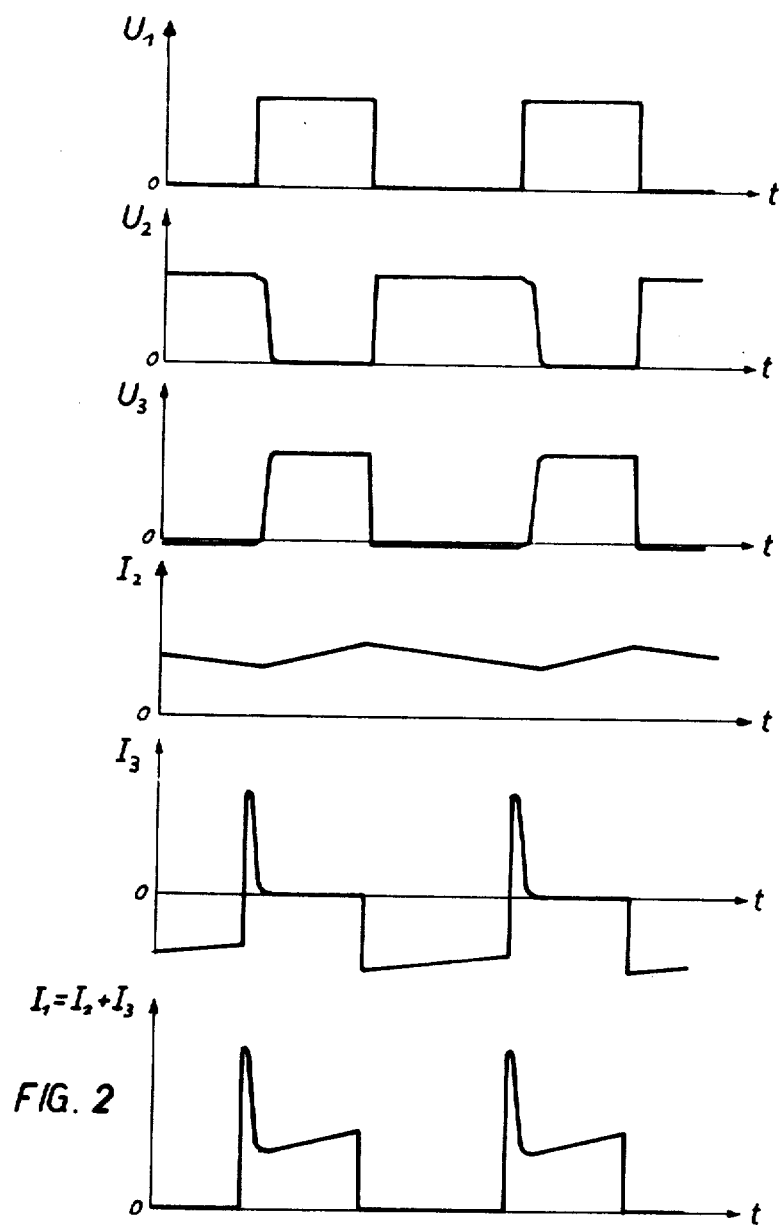
Figure 4:
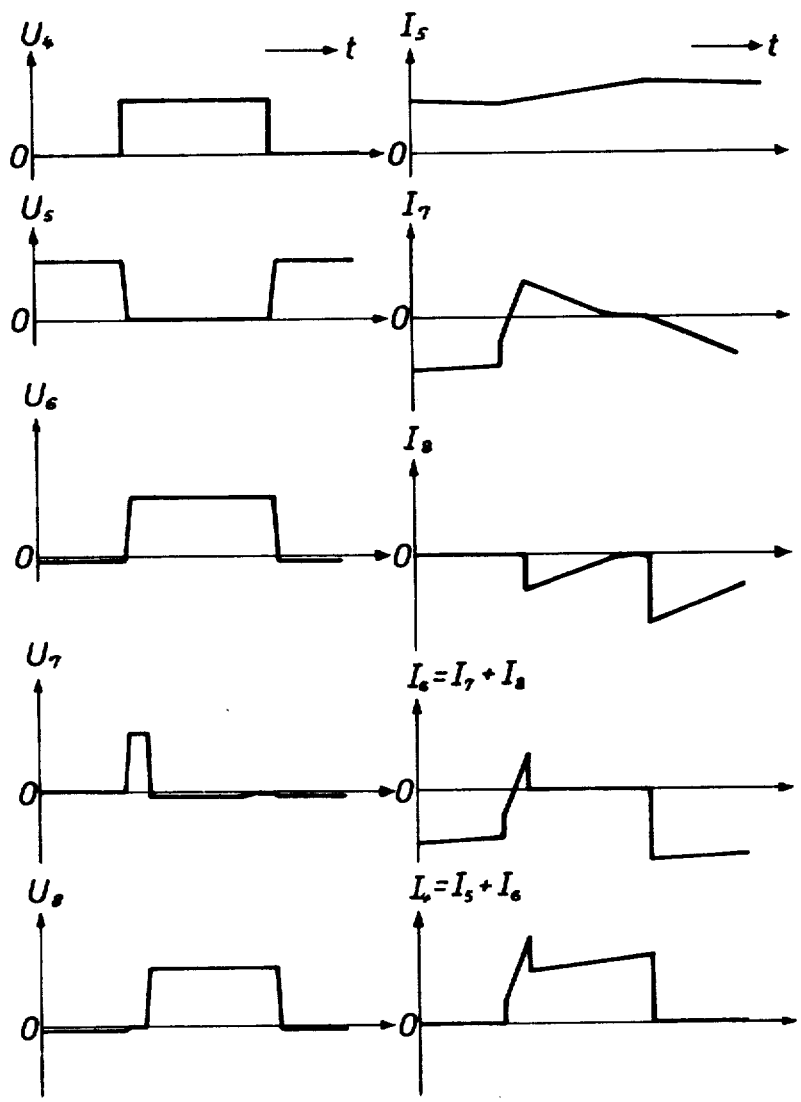
Figure 5:
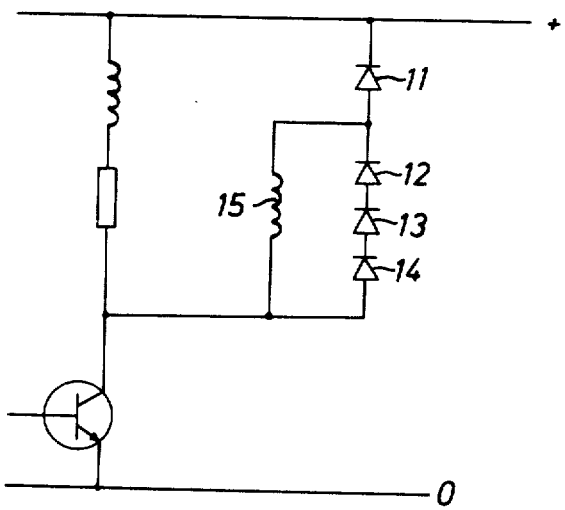
Figures 6, 7:
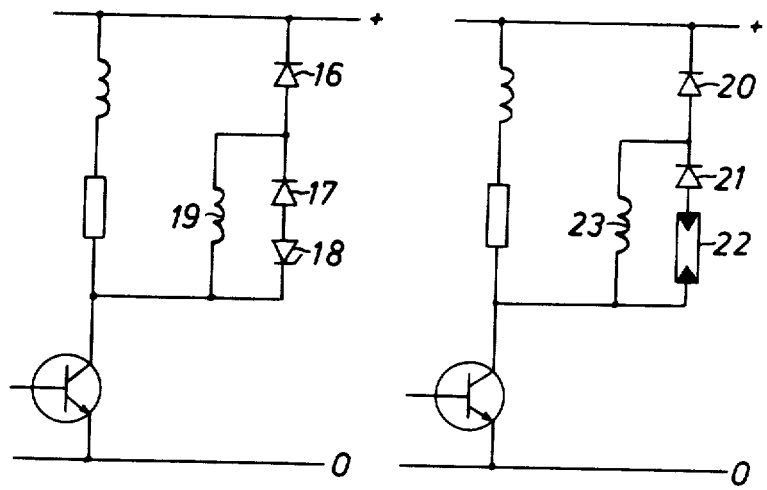
Figure 8:
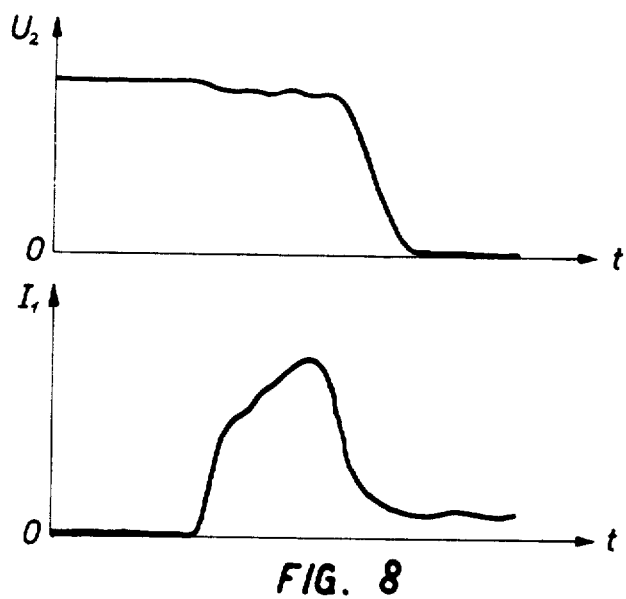
Figure 9:
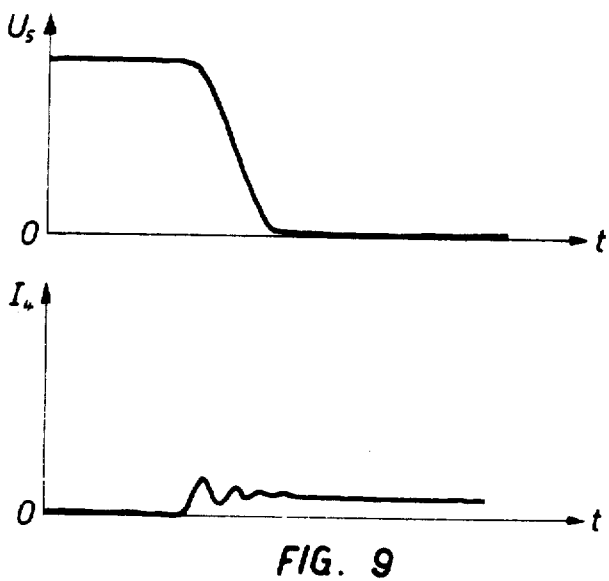
Figure 10:
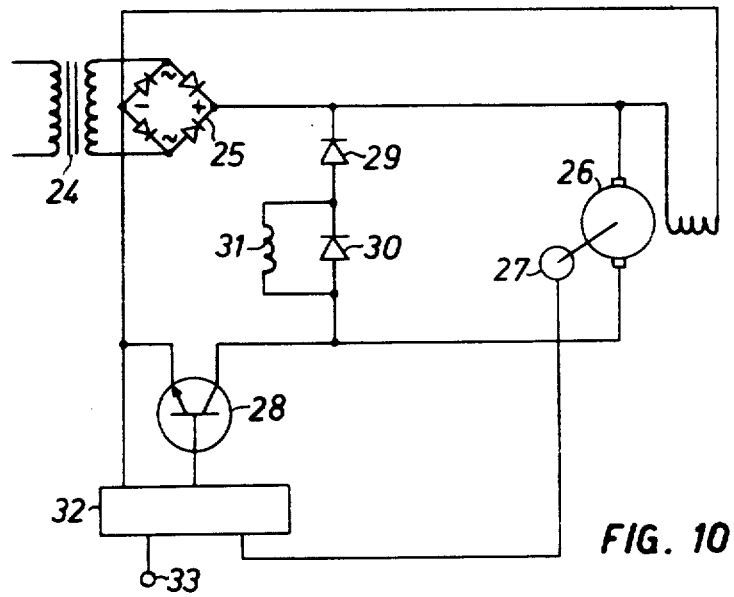
Figure 11:
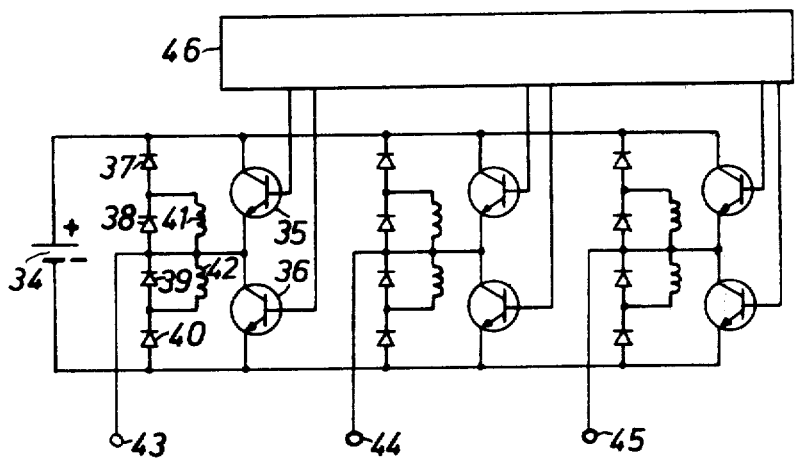
Figure 12:
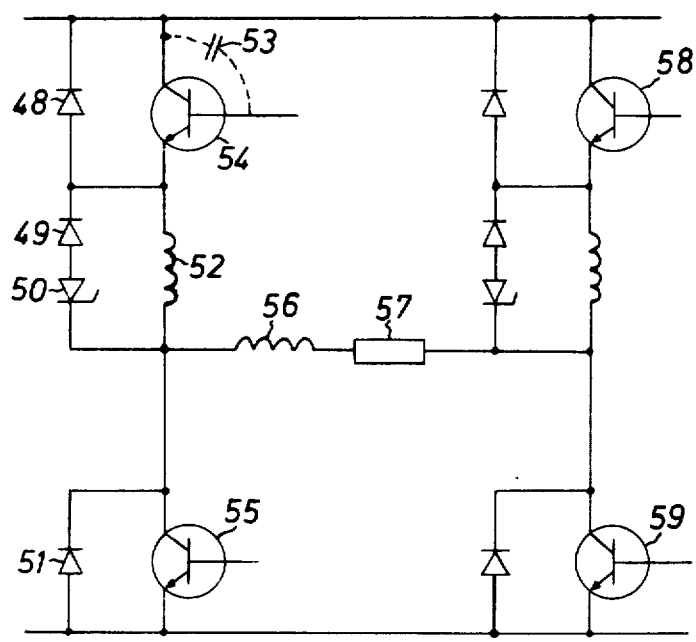

These and other objects and advantages of the invention will become more apparent from the following detailed description and appended claims taken in conjunction with the accompanying drawings in which:

FIG. 1 illustrates a known current circuit arrangement;

FIG. 2 graphically illustrates the voltage and currents corresponding to the current circuit arrangement according to FIG. 1;

FIG. 3 schematically illustrates a current circuit arrangement according to the invention in which a diode is placed in series with the voltage limiting diode and a reactance member is placed in parallel with the added diode;

FIG. 4 graphically illustrates the voltages and currents corresponding to the current circuit arrangement shown in FIG. 3;

FIGS. 5, 6 and 7 each illustrate further examples of current circuit arrangements according to the invention;

FIGS. 8 and 9 each illustrates a comparison of the collector-emitter voltage and the collector current of a transistor in the arrangement according to FIG. 1 and in the arrangement according to FIG. 3; and FIGS. 10, 11 and 12 each illustrate the use of the current circuit arrangement according to the invention in various embodiments.

Referring to FIG. 1, a known current circuit arrangement includes a power transistor 1 which switches a load consisting of a resistor 2 and of a reactance 3. In addition, a voltage limiting diode 4 which is reverse-biased while the transistor is switched on is arranged parallel with the load. The theoretical course of the currents and voltages of this arrangement are shown in FIG. 2 under the condition that a load current $I_z$ has no gap. If the transistor 1 is suddenly blocked, i.e., is switched off, the current $I_2$ flows on via the diode 4 in such a manner that a voltage $U_2$ can increase only by the voltage drop of the diode 4 in the conducting direction above a supply voltage $U_3$. In this manner, the transistor 1 is efficiently protected against destruction by voltage peaks while switched off.

However, as the diode 4 is reverse biased if the transistor 1 is switched on by activating a base-emitter voltage $U_1$, a high current peak $I_3$ is generated due to the clearing of the barrier layer of charge carriers. As a collector current $I_1$ is composed of the currents $I_2$ and $I_3$, the current peak $I_3$ would have to be taken over by the transistor 1. As the current amplification diminishes with increasing collector current, particularly in power transistors, the transistor cannot take over this current peak. The transistor thus will not be saturated but will have a collector current at a collector-emitter voltage which is somewhat lower than the supply voltage. This collector current will depend on the individual characteristics of the transistor and of the base-emitter current and, as such, cannot be controlled. As a result, the collector current can exceed admissible values (see FIG. 8).

As mentioned initially, during a certain time span, an extremely high collector current $I_1$ thus flows at a collector-emitter voltage $U_2$, which almost equals the supply voltage $U_3$. The course of the voltage $U_2$ and of the current $I_1$ are thus similar as shown theoretically in FIG. 2 and as shown according to reality in FIG. 8. Thus, during the switch-on period, they cause an extremely high power dissipation in the transistor over a relatively long period of time.

Referring to FIG. 3, the current circuit arrangement according to the invention has a non-linear resistance member consisting of a diode 9 arranged in series with a voltage limiting diode 8 and a reactance member 10 arranged in parallel to the diode 9. The theoretical graph of the voltages and currents in this arrangement is shown in FIG. 4 under the condition that the load current $I_5$ has no gap.

The function of the current circuit arrangement of FIG. 3 is described in the following. As a transistor 5 is switched off, the load current $I_5$ is taken over by the two diodes 8 and 9. The reactance 10 carries no current at first, gradually however, the reactance 10 takes over the current carried by the diode 9. As a condition, the voltage time area and ohmic resistance of the reactance 10 are chosen so small that the whole current $I_6$ flows via the reactance 10 before the transistor 5 is switched on again and that a very small voltage in the forward direction prevails at the diode 9 so that the diode does not carry any noticeable current. For switching-off, the two diodes 8, 9 are effective in series at first and, after a short time, only the voltage drop at the diode 8 remains.

As the transistor 5 is switched on again, the current $I_6$ at first would equal the load current $I_5$ if the reactance 10 would not be saturated. However, the reactance 10 is dimensioned to be saturated. As a result, the current $I_7$, and also the current $I_6$, diminishes within a short time to the saturation current of the reactance 10. The differential current $I_4$ of the currents $I_5$ and $I_6$ immediately is taken over by the transistor 5. From now on, the voltage $U_7$, which almost equals the supply voltage $U_B$, prevails at the reactance 10. Thus, the current $I_7$ diminishes, changes sign and increases in the reverse direction. Upon the change of the current direction of the current $I_7$, the diode 8 is supplied with reverse current so that the charge carriers are removed from the barrier layer. As soon as the barrier layer is cleared, the diode 8 takes over the reverse voltage. Thus, the voltage $U_7$ at the reactance 10 breaks down and the current $I_7$ stops increasing but gradually diminishes via the diode 9 to zero.

As it can be seen in FIG. 4, the transistor 5 is not required to supply a high current peak to the charge carriers for reverse biasing the diode 8 as the whole process of reverse biasing the diode 8 is extended over a relatively long span of time. The collector current $I_4$, thus, does not reach the zone where the current amplification of the transistor is no longer sufficient. As a result, the collector-emitter voltage $U_5$ rapidly falls to the low saturation value.

As mentioned before, the voltage time area of the reactance 10 is to be chosen small enough so that the voltage $U_7$ prevailing at the reactance 10 during the switching-off time of the transistor 5 is sufficient to bring the transistor 5 to the state of saturation, or at least to allow the voltage $U_7$ to drop to so low a value that the diode 9 is in a non-conductive state. In this arrangement, it is a self-evident requirement that the ohmic voltage drop in the reactance 10 is also so small that a noticeable voltage drop does not occur in comparison with the forward voltage of the diode 9.

In order to switch the transistor on again, the reactance 10 must not become saturated until the reverse biasing voltage is built up over the diode 8. That is, the current $I_7$, according to FIG. 4, is to increase in the direction indicated from zero up to such a large positive value that the charge supplied into the diode during this time span clears the barrier layer. The reactance 10 is thus chosen to be larger than the voltage time area determined by the supply voltage $U_B$ and the time span of the positively increasing current flow $I_7$, divided by the maximum current flowing at the end of this period which, in turn, is to show twice the value of the charge stored in the diode divided by the time span mentioned.

As can be seen from the above mentioned requirements, the voltage time area of the reactance is to be chosen with a minimum value. On the other hand, the voltage time area is not to exceed a maximum value. Thus, dimensioning of the reactance 10 can present difficulties which increase with increasing switching frequency. These difficulties can be eliminated, if further diodes or a non-linear resistance are arranged in series with the additional diode. The voltage peak generated by a switching off of the transistor is increased only to a small extent by this measure. However, at the same time, a noticeably greater voltage is available for forcing the current to be taken over by the reactance 10. Thus, the voltage time area of the reactance can be larger so that the switch-on requirements for the transistor can be fulfilled more easily.

in FIGS. 5 to 7, various examples are shown in which an additional diode and further non-linear resistance members are arranged in series to the additional diode. FIG. 5 shows, in addition to a diode 12, two further diodes 13 and 14. However, one of the latter diodes 13, 14 might be eliminated. In FIG. 6, a zener diode 18 is arranged in series with the diode 17, whereas in FIG. 7 a non-linear resistor 22 is shown arranged in series with a diode 21. As the non-linear resistor 22 shows a non-linear current voltage characteristic, the voltage increases less than proportionally as the current increases, in such a manner that a similar function is achieved as in the arrangement using a zener diode.

Referring to FIG. 8, the collector current $I_1$ and the collector-emitter voltage $U_2$ of a transistor 1 according to the current circuit arrangement shown in FIG. 1, which transistor periodically switches an inductive load, are plotted as a function of the time t as recorded on an oscilloscope. Upon switching the transistor 1 on, the current $I_1$ rises to a high value. However, the voltage $U_2$ over the transistor diminishes slightly only as long as this high current persists since the required collector current cannot be supplied. Thus, a very high power dissipation results and a current overload results.

Referring to FIG. 9, the collector current $I_4$ and the collector-emitter voltage $U_5$ of the transistor 5 of FIG. 3 are shown under the same operating conditions as in the example described above with reference to FIG. 8. The diagram scales of time, current and voltage in FIGS. 8 and 9 are the same. Upon switching on the transistor 5, very low current peaks $I_4$ are obtained and the voltage $U_5$ over the transistor 5 immediately begins dropping. As the current peaks caused by the voltage limiting diode are small, the collector-emitter voltage drops to the saturation voltage within a short time. The power dissipation of the power transistor during the switching-on of an inductive load, which still carries a current due to the preceding switching cycle, is thus diminished and in particular, influences the transistor during a short time only. The comparison of FIGS. 8 and 9 clearly shows the considerable advantages of the inventive current circuit arrangement.

Referring to FIG. 10, the current circuit arrangement may also be used in a power transistor circuit using a transistor chopper for controlling the rotational speed of a small direct current motor. As shown, a direct current motor 26 in a shunt arrangement is supplied from a network transformer 24 via a rectifier bridge arrangement 25. A tachometer 27 delivers a voltage proportional to the rotational speed of the motor 26 to a control device 32 in which the voltage is compared with a preset voltage 33. Depending on the value of any deviation between the two voltages, a power transistor 28 is conducting or opened or reversed, i.e., blocked, at short intervals with the ratio of the conducting or blocking times determining the average voltage supplied to the motor 26. In addition to a usual current limiting diode 29, the circuit arrangement contains a further diode 30 and a reactance 31 in parallel. Using this arrangement, the switch-on power dissipation of the transistor 28 is reduced to a large extent. Instead of the motor 26, the load may be in the form of a relay coil or switch (contactor) coil, or a power magnet could be switched-in an intermittent operation mode with the switch-off time of such elements being so short that the transistor is switched on again before the current has diminished completely.

Referring to FIG. 11, the current circuit arangement may also be used in a transistor invertor arrangement for an ohmic-inductive load. In this arrangement, a load is connected to the input terminals 43, 44, 45 and can consist of e.g., an asynchronous motor. A battery 34 is connected via two transistors 35, 36 with the input terminal 43 of the load. This terminal point 43 is in a positive, negative or floating state depending on the switching state of the two transistors 35, 36. In the same manner also, the transistors for the terminals 44 and 45 are switched from a control device 46 so that a threephase alternating voltage is generated at the terminals 43, 44, 45 for operating the load. Instead of using the usual single current limiting diodes, each of the power transistors is provided with a second diode and each with a reactance so that the losses or dissipation of the transistors can be kept to a minimum during the switch-off time as well as during the switch-on time.

Referring to FIG. 12, the current circuit arrangement may also be used with a power transistor invertor stage. To this end, as shown, if the transistors 54 and 59 are blocked, if a transistor 58 is in a conductive state and a transistor 55 is intermittently blocked, and if the load consists of a reactance 56 and of a resistance 57, the switching transistor 55, as mentioned above, is protected by a zener diode 50, a diode 49 and a reactance 52 against excessive current peaks during the switch-on time.

In the absence of the inventive circuit arrangement, at the moment at which the transistor 55 becomes conductive, the emitter of the transistor 54 would be jerked from a positive to a negative potential very quickly since the transistor 54 could only carry collector current during a short time due to the collector base capacity 53 impressing a current in the base of the transistor 54. However, in the case of the circuit arrangement shown, as the diode 49 is reversed biased before and the diode 48 conductive and thus enriched with charge carriers, the whole voltage drop is taken over by the reactance 52 and is only slowly transferred to the emitter of the transistor 54 and to the diode 48. Thus, the rise of the reverse voltage at the transistor 54 is considerably slower.

What is claimed is:

1. A current circuit arrangement for reducing the switch-on power dissipation of a power transistor which intermittently switches a direct current voltage to an ohmic-inductive load, said arrangement comprising
    a voltage limiting diode disposed in parallel to the load, said diode being biased in a blocking condition with said transistor in a conducting state and in a conducting condition with said transistor in a reverse-biased state;
    a non-linear resistance member connected in series with said voltage limiting diode, said member including at least one additional diode; and
    a low ohmic reactance member connected in parallel with said resistance member, said reactance member having a voltage time area sufficiently large to have the reactance limit the current after a repeated switch-on of said transistor until said voltage limiting diode takes up a reverse voltage and sufficiently small to have the voltage across said reactance member upon switching off said transistor diminish to a value lower than the forward voltage drop of said non-linear resistance member before said transistor is again switched on.

2. A current circuit arrangement as set forth in claim 1 wherein said non-linear resistance member further includes at least two diodes arranged in series.

3. A current circuit arrangement as set forth in claim 1 wherein said non-linear resistance member includes a diode and a zener diode arranged in series.

4. A current circuit arrangement as set forth in claim 1 wherein said non-linear resistance member includes a diode and a non-linear resistor arranged in series.

5. A transistor invertor circuit arrangement for switching an ohmic inductive load in an intermittent manner comprising a power transistor for switching the load on and off;

a current circuit arrangement connected to said power transistor for reducing the switch-on dissipation of said power transistor, said current circuit arrangement including a voltage limiting diode disposed in parallel to the load, said diode being biased in a blocking condition with said transistor in a conducting state and in a conducting condition with said transistor in a reverse-biased state;

a non-linear resistance member connected in series with said voltage limiting diode, said member including at least one additional diode; and a low ohmic reactance member connected in parallel with said resistance member, said reactance member having a voltage time area sufficiently large to have the reactance limit the current after a repeated switch-on of said transistor until said voltage limiting diode takes up a reverse voltage and sufficiently small to have the voltage across said reactance member upon switching off said transistor diminish to a value lower than the forward voltage drop of said non-linear resistance member before said transistor is again switched on.

6. A transistor invertor circuit arrangement as set forth in claim 5 wherein said load is selected from the group consisting of a direct current motor, a relay coil, a switch coil, and a power magnet.

7. A transistor invertor circuit arrangement as set forth in claim 5 wherein said load is a direct current chopper.

8. A transistor invertor circuit arrangement as set forth in claim 5 wherein said load is a three-phase load.

9. A transistor invertor circuit arrangement as set forth in claim 8 wherein said three-phase load is an asynchronous motor.

* * * * *